(12) United States Patent
Do et al.

(10) Patent No.: US 7,863,099 B2
(45) Date of Patent: Jan. 4, 2011

(54) INTEGRATED CIRCUIT PACKAGE SYSTEM WITH OVERHANGING CONNECTION STACK

(75) Inventors: Byung Tai Do, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 486 days.

(21) Appl. No.: 11/769,512

(22) Filed: Jun. 27, 2007

(65) Prior Publication Data
US 2009/0001593 A1 Jan. 1, 2009

(51) Int. Cl.
*H01L 21/44* (2006.01)

(52) U.S. Cl. .................. 438/109; 438/107; 438/108; 438/124; 257/687; 257/697; 257/773; 257/776; 257/E21.503

(58) Field of Classification Search ............ None
See application file for complete search history.

(56) References Cited

U.S. PATENT DOCUMENTS

| | | | |
|---|---|---|---|
| 6,380,635 B1 * | 4/2002 | Manning et al. | 257/784 |
| 6,858,945 B2 * | 2/2005 | Rakshani | 257/786 |
| 6,863,208 B2 | 3/2005 | Lee | |
| 7,009,305 B2 * | 3/2006 | Carberry | 257/780 |
| 7,044,357 B2 | 5/2006 | Mii | |
| 2002/0014691 A1 * | 2/2002 | Yoon et al. | 257/697 |
| 2005/0012212 A1 * | 1/2005 | Gilleo | 257/737 |
| 2005/0093152 A1 * | 5/2005 | Fjelstad et al. | 257/738 |
| 2005/0133932 A1 * | 6/2005 | Pohl et al. | 257/777 |
| 2006/0001157 A1 * | 1/2006 | Carberry | 257/738 |
| 2006/0057833 A1 * | 3/2006 | Kim et al. | 438/612 |
| 2006/0113665 A1 | 6/2006 | Lee et al. | |
| 2006/0144907 A1 | 7/2006 | Kadoguchi et al. | |
| 2006/0175697 A1 * | 8/2006 | Kurosawa et al. | 257/686 |
| 2006/0180943 A1 * | 8/2006 | Miwa et al. | 257/777 |

OTHER PUBLICATIONS http://www.siliconfareast.com/wirebond.htm, © 2001-2006.*

* cited by examiner

*Primary Examiner*—N Drew Richards
*Assistant Examiner*—Kyoung Lee
(74) *Attorney, Agent, or Firm*—Mikio Ishimaru

(57) ABSTRACT

An integrated circuit package system comprising: providing a first conductive line adjacent to a second conductive line; forming a first connection stack over the first conductive line with the first connection stack overhanging the second conductive line; connecting an integrated circuit device and the first connection stack; and encapsulating the integrated circuit device and the first connection stack.

17 Claims, 3 Drawing Sheets

INTEGRATED CIRCUIT PACKAGE SYSTEM WITH OVERHANGING CONNECTION STACK

TECHNICAL FIELD

The present invention relates generally to an integrated circuit package system, and more particularly to an integrated circuit package system with electrical interconnects.

BACKGROUND ART

Across all sectors, industries, and geographies, demands continue for the electronic industry to provide products that are lighter, faster, smaller, multi-functional, more reliable, and more cost-effective. In order to meet these requirements of so many and varied consumers, more electrical circuits need to be more highly integrated to provide the functions demanded. Across virtually all applications, there continues to be growing demand for reducing size, increasing performance, and improving features of integrated circuits.

These seemingly endless requirements are no more visible than with products in our daily lives. Smaller and denser integrated circuits are required in many portable electronic products, such as cellular phones, portable computers, voice recorders, etc. as well as in many larger electronic systems, such as cars, planes, industrial control systems, etc.

As the demand grows for smaller electronic products with more features, manufacturers are seeking ways to include more features as well as reduce the size of the integrated circuits. Increased miniaturization of electronic products typically involves miniaturization of components, greater packaging density of integrated circuits ("ICs"), higher performance, and lower cost. As new generations of electronic products are released, the number of integrated circuits used to fabricate them tends to decrease due to advances in technology. Simultaneously, the functionality of these products increases.

Semiconductor package structures continue to advance toward miniaturization to increase the density of the components that are packaged therein while decreasing the sizes of the end products having the IC products. This is in response to continually increasing demands on information and communication apparatus for ever-reduced sizes, thicknesses, and costs, along with ever-increasing performance.

Different challenges arise from increased functionality integration and miniaturization. For example, a semiconductor product having increased functionality may be made smaller but may still be required to provide a large number of inputs/outputs (I/O) interface. The size reduction increases the I/O density or decreases the I/O pitch for the integrated circuit package and its respective integrated circuit carriers.

The ever-increasing I/O density trend presents a myriad of manufacturing problems. Some of these problems reside integrated circuit manufacturing realm, such as fine pitch connections and reliability of these connections. Others problems involve mounting these increase I/O density integrated circuits on carriers for packaging. Yet other problems reside in the realm of the printed circuit board or the system board that receives the integrated circuit package having the fine pitch I/O.

As an example of the problems of reduced I/O pitch, wire bonding on the substrate is limited to a flat width on a bond finger or trace surface to secure a reliable bond on it. A bond which is partially positioned outside a width of the bond site of bond finger or trace can result in weak bonding or shorting with adjacent lead fingers.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

An integrated circuit package system comprising: providing a first conductive line adjacent to a second conductive line; forming a first connection stack over the first conductive line with the first connection stack overhanging the second conductive line; connecting an integrated circuit device and the first connection stack; and encapsulating the integrated circuit device and the first connection stack.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
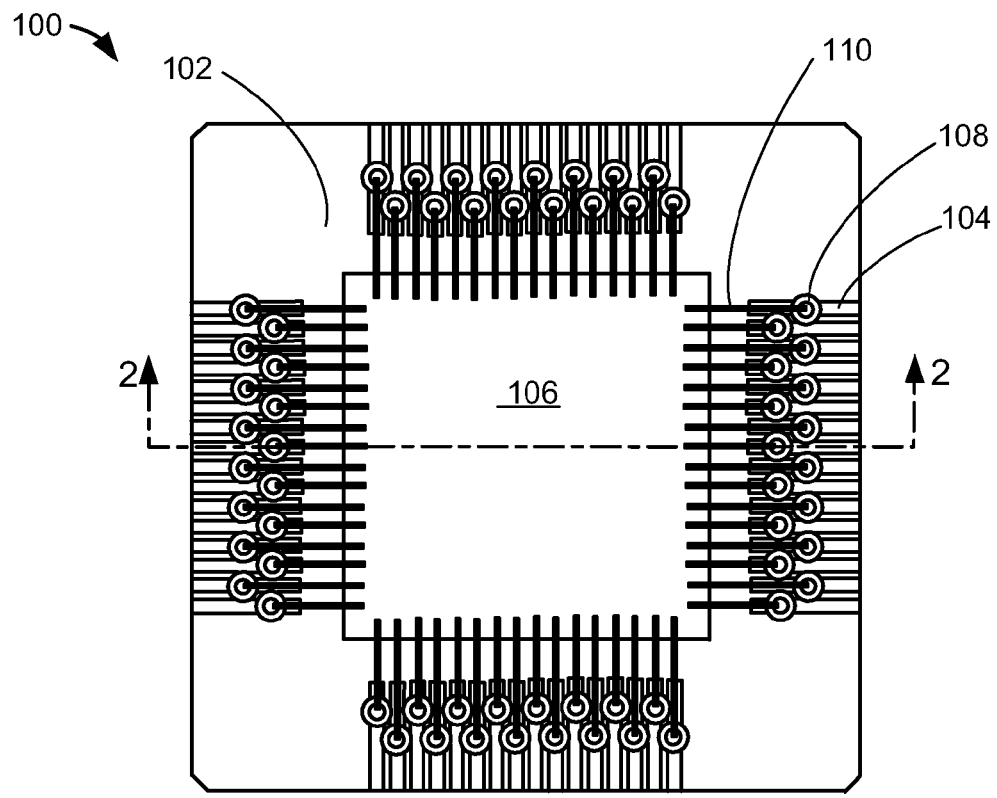
FIG. 1 is a plan view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a plan view of an integrated circuit package system 100 in an embodiment of the present invention. The plan view depicts the integrated circuit package system 100 without a top cover. The plan view depicts a carrier 102, such as a laminate substrate, having conductive lines 104, such as routing traces.

An integrated circuit device 106, such as an integrated circuit die, mounts over the carrier 102. Connection stacks 108, such as stacked bump support pedestals, are preferably over predetermined portions of the carrier 102 and over the conductive lines 104. Internal interconnects 110, such as reverse stand-off stitch bonds (RSSB) wires, ribbon bond wires, or bond wires, preferably connect the integrated circuit device 106 and a predetermined selection of the connection stacks 108.

For illustrative purposes, the integrated circuit package system 100 is shown with the carrier 102 as a laminate substrate, although it is understood that the integrated circuit package system 100 may have a different type of the carrier 102. For example, the carrier 102 may be formed from a lead frame (not shown) with the integrated circuit package system 100 having leads (not shown). Also for illustrative purposes, the invention is shown with an embodiment of the integrated circuit package system 100, although it is understood that the present invention with the connection stacks 108 may be formed at different system levels, such as a printed circuit board or a system board not included in the integrated circuit package system 100.

Figure 2:
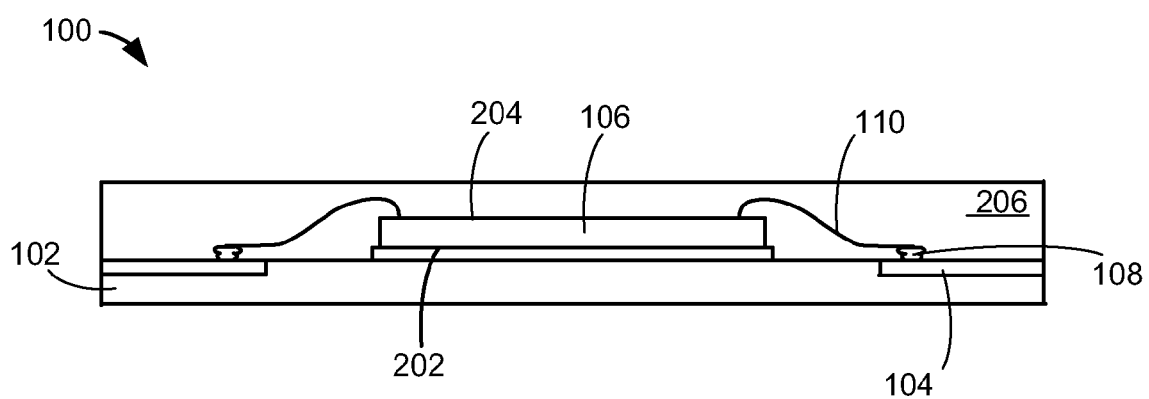
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depict the integrated circuit device 106 having a non-active side 202 and an active side 204 over the carrier 102 with the non-active side 202 facing the carrier 102. The active side 204 preferably has circuitry fabricated thereon.

The connection stacks 108 are preferably over the conductive lines 104 providing electrical connection path between the internal interconnects 110 and the conductive lines 104. As described earlier, the internal interconnects 110 connect the active side 204 of the integrated circuit device 106 and the connection stacks 108. An encapsulation 206, such as an epoxy molding compound (EMC), is preferably over the integrated circuit device 106, the internal interconnects 110, and the connection stacks 108 over the carrier 102.

Figure 3:
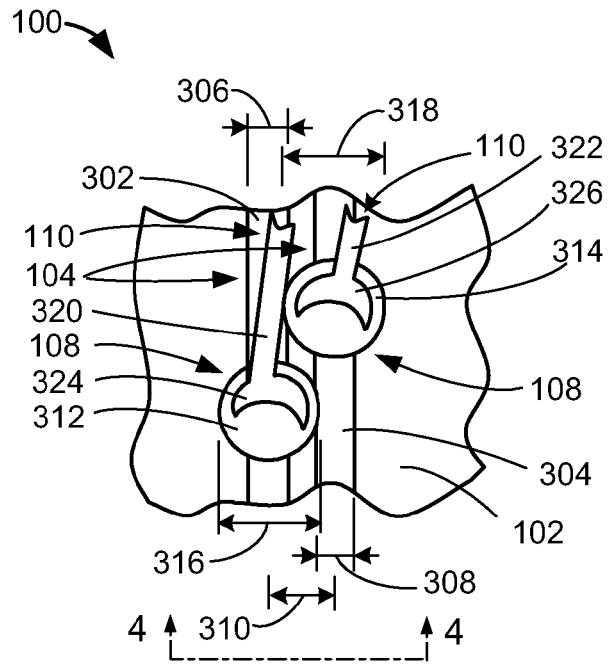
FIG. 3 is a more detailed plan view of the connection stacks over the carrier.

Referring now to FIG. 3, therein is shown a more detailed plan view of the connection stacks 108 over the carrier 102. The plan view depicts a portion of the carrier 102 with the conductive lines 104 including a first conductive line 302 and a second conductive line 304 exposed. The first conductive line 302 preferably has a first line width 306. The second conductive line 304 preferably has a second line width 308. For illustrative purposes, the first line width 306 and the second line width 308 are shown substantially the same, although it is understood that the first line width 306 and the second line width 308 may be different.

A pitch 310 preferably illustrates a separation between the first conductive line 302 and the second conductive line 304, wherein the pitch 310 may be a measure from the equivalent location at the first conductive line 302 and the second conductive line 304. For example, the pitch 310 may be measured between a side of the first conductive line 302 and the same side of the second conductive line 304. As another example, the pitch 310 may be measured between centers of the first conductive line 302 and the second conductive line 304. For illustrative purposes, the pitch 310 illustrates the separation of the conductive lines 104, although it is understood that a portion of the conductive lines 104 may be separated by a different value or a different pitch (not shown).

The connection stacks 108 are depicted preferably including a first connection stack 312 over the first conductive line 302 and a second connection stack 314 over the second conductive line 304. The first connection stack 312 and the second connection stack 314 are preferably in an overhanging staggered configuration such that the first connection stack 312 and the second connection stack 314 do not contact each other.

The first connection stack 312 and the second connection stack 314 are preferably centered or approximately centered over the first conductive line 302 and the second conductive line 304, respectively. The first connection stack 312 preferably has a first top width 316. The second connection stack 314 preferably has a second top width 318. For illustrative purposes, the first top width 316 and the second top width 318 are shown substantially the same, although it is understood that the first top width 316 and the second top width 318 may be different.

The first top width 316 is preferably greater than the first line width 306 such that the first connection stack 312 extends beyond the first conductive line 302 and overhanging at least a portion of the second conductive line 304. The second top width 318 is preferably greater than the second line width 308 such that the second connection stack 314 extends beyond the second conductive line 304 and overhanging at least a portion of the first conductive line 302. If the first conductive line 302 and the second conductive line 304 were not in the overhanging staggered configuration as shown, the first connection stack 312 and the second connection stack 314 would contact each other and may not be centered above the first conductive line 302 and the second conductive line 304, respectively.

The internal interconnects 110 include a first interconnect 320 and a second interconnect 322. The first interconnect 320 preferably connects to the first connection stack 312. The first connection stack 312 provides a predetermined surface area for a first stitch bond 324 of the first interconnect 320 with the first connection stack 312. The second interconnect 322 preferably connects to the second connection stack 314. The second connection stack 314 provides a predetermined surface area for a second stitch bond 326 of the second interconnect 322 with the second connection stack 314.

The overhanging staggered configuration of the first connection stack 312 and the second connection stack 314 mitigates or eliminates inadvertently shorting of the first interconnect 320 and the second interconnect 322. The overhanging staggered configuration also provides the integrated circuit package system 100 to have a higher density of the internal interconnects 110. The connection stacks 108 in the overhanging staggered configuration further provides each of the connection stacks 108 preferably centered over the conductive lines 104 resulting in a more reliable connection and signal quality. Also, the connection stacks 108 protect the conductive lines 104 from damage that may result from the connection process of the internal interconnects 110.

Figure 4:
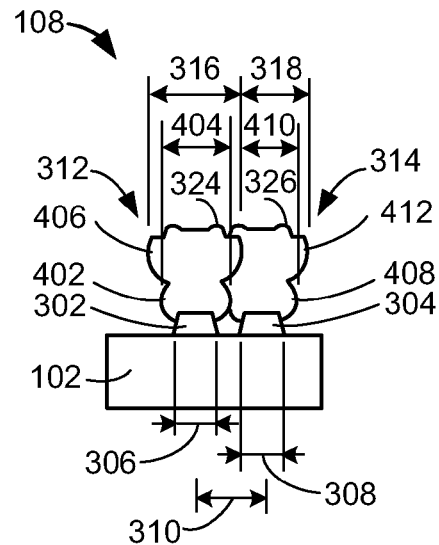
FIG. 4 is a more detailed cross-sectional view of the connection stacks over the carrier along line 4-4 of FIG. 3.

Referring now to FIG. 4, therein is shown a more detailed cross-sectional view of the connection stacks 108 over the carrier 102 along line 4-4 of FIG. 3. The cross-sectional view depicts the first connection stack 312 and a portion of the second connection stack 314. A further portion of the second connection stack 314 not depicted overlaps the first connection stack 312 in this cross-sectional view.

The cross-sectional view depicts the first conductive line 302 and the second conductive line 304 over the carrier 102. For illustrative purposes, the first conductive line 302 and the second conductive line 304 are shown over the carrier 102, although it is understood that the first conductive line 302 and the second conductive line 304 may not be over the carrier 102. For example, the first conductive line 302 and the second conductive line 304 may be in the carrier 102 and exposed by a mask (not shown), such as a solder mask. The first conductive line 302 and the second conductive line 304 are shown in a trapezoid geometric shape with the shorter base facing away from the carrier 102.

The first connection stack 312 includes a first bottom structure 402 having a first bottom width 404 and a first top structure 406 having the first top width 316. The first top width 316 and the first bottom width 404 are preferably measures of the widest portion of the first top structure 406 and the first bottom structure 402, respectively. The first bottom structure 402 and the first top structure 406 may be formed with a number of different types of structures, such as conductive bumps, conductive balls, conductive columns, conductive posts, or a combination thereof. For illustrative purposes, the first connection stack 312 is shown having two levels with the first bottom structure 402 and the first top structure 406, although it is understood that the first connection stack 312 may have a different number of levels.

The first connection stack 312 is preferably centered over the first conductive line 302. The first bottom structure 402 is preferably centered over the first conductive line 302 and below the first top structure 406. The first stitch bond 324 is preferably over the first top structure 406. The first bottom width 404 is preferably greater than the first line width 306 and the first top width 316 is greater than the first bottom width 404 depicting the first connection stack 312 in an inverted multi-level conical geometric shape.

Similarly, the second connection stack 314 includes a second bottom structure 408 having a second bottom width 410 and a second top structure 412 having the second top width 318. The second top width 318 and the second bottom width 410 are preferably measures of the widest portion of the second top structure 412 and the second bottom structure 408, respectively. The second bottom structure 408 and the second top structure 412 may be formed with a number of different types of structures, such as conductive bumps, conductive balls, conductive columns, conductive posts, or a combination thereof. For illustrative purposes, the second connection stack 314 is shown having two levels with the second bottom structure 408 and the second top structure 412, although it is understood that the second connection stack 314 may have a different number of levels.

The second connection stack 314 is preferably centered over the second conductive line 304. The second bottom structure 408 is preferably centered over the second conductive line 304 and below the second top structure 412. The second stitch bond 326 is preferably over the second top structure 412. The second bottom width 410 is preferably greater than the second line width 308 and the second top width 318 is greater than the second bottom width 410 depicting the second connection stack 314 in an inverted multi-level conical geometric shape.

The first connection stack 312 and the second connection stack 314 in the overhanging staggered configuration provides additional degrees of freedom to reduce the pitch 310 between the first conductive line 302 and the second conductive line 304. The first bottom structure 402 and the second bottom structure 408 provide for a centered and robust connection with the first conductive line 302 and the second conductive line 304, respectively. Also, the first top structure 406 and the second top structure 412 provide sufficient surface area for the first interconnect 320 of FIG. 3 and the second interconnect 322 of FIG. 3, respectively.

Figure 5:
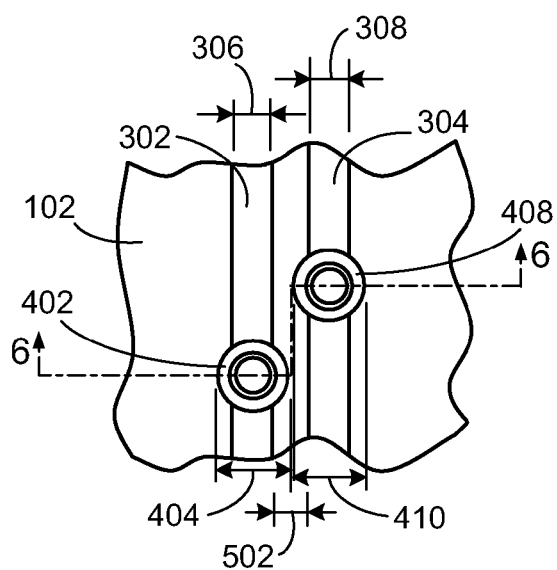
FIG. 5 is a plan view of a portion of the carrier in a forming phase of the first bottom structure and the second bottom structure.

Referring now to FIG. 5, therein is shown a plan view of a portion of the carrier 102 in a forming phase of the first bottom structure 402 and the second bottom structure 408. The plan view depicts the first conductive line 302 and the second conductive line 304 substantially parallel to each other. The first bottom structure 402 and the second bottom structure 408 are preferably formed over the first conductive line 302 and the second conductive line 304, respectively.

The first bottom structure 402 having the first bottom width 404 preferably extends over the first conductive line 302 having the first line width 306 and into a space 502 between the first conductive line 302 and the second conductive line 304. The first bottom structure 402 preferably does not extend over the second conductive line 304.

The second bottom structure 408 having the second bottom width 410 preferably extends over the second conductive line 304 having the second line width 308 and into the space 502 between the second conductive line 304 and the second conductive line 304. The second bottom structure 408 preferably does not extend over the first conductive line 302.

Figure 6:
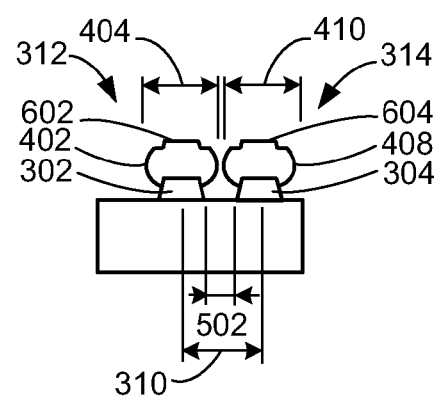
FIG. 6 is a cross-sectional view of the structure of FIG. 5 along line 6-6 of FIG. 5.

Referring now to FIG. 6, therein is shown a cross-sectional view of the structure of FIG. 5 along line 6-6 of FIG. 5. The cross-sectional view depicts the pitch 310 and the space 502 between the first conductive line 302 and the second conductive line 304. The first bottom structure 402 having the first bottom width 404 is preferably over and partially covering the first conductive line 302. The first bottom structure 402 also preferably extends into the space 502 between the first conductive line 302 and the second conductive line 304. The first bottom structure 402 does not extend over the second conductive line 304.

A first bottom protrusion 602 preferably extends from a top portion of the first bottom structure 402. The first bottom protrusion 602 preferably has a planar top surface. The first bottom protrusion 602 may assist in the formation of the first connection stack 312 of FIG. 4, such as forming an intermetallic compound (IMC).

Similarly, the cross-sectional view depicts the second bottom structure 408 having the second bottom width 410 is preferably over and partially covering the second conductive line 304. The second bottom structure 408 also preferably extends into the space 502 between the first conductive line 302 and the second conductive line 304. The second bottom structure 408 does not extend over the first conductive line 302.

A second bottom protrusion 604 preferably extends from a top portion of the second bottom structure 408. The second bottom protrusion 604 preferably has a planar top surface. The second bottom protrusion 604 may assist in the formation of the second connection stack 314 of FIG. 4, such as forming an intermetallic compound (IMC).

Figure 7:
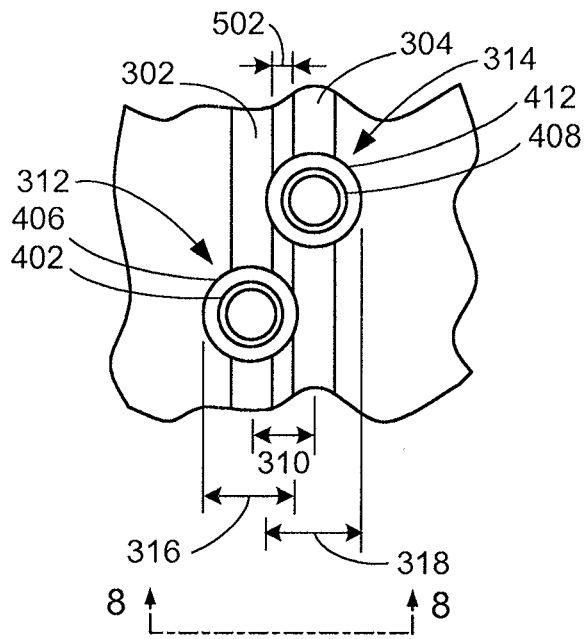
FIG. 7 is the structure of FIG. 5 in a forming phase of the first connection stack and the second connection stack.

Referring now to FIG. 7, therein is shown the structure of FIG. 5 in a forming phase of the first connection stack 312 and the second connection stack 314. The structure of FIG. 7 depicts the pitch 310 and the space 502 between the first conductive line 302 and the second conductive line 304. The first top structure 406 and the second top structure 412 are preferably formed over the first bottom structure 402 of FIG. 6 and the second bottom structure 408 of FIG. 6, respectively, forming the first connection stack 312 and the second connection stack 314.

The first top structure 406 having the first top width 316 preferably extends over the first conductive line 302, the space 502, and overhangs at least a portion of the second conductive line 304. Similarly, the second top structure 412 having the second top width 318 preferably extends over the second conductive line 304, the space 502, and overhangs at least a portion of the first conductive line 302. The overhanging staggered configuration of the first connection stack 312 and the second connection stack 314 mitigates or prevents the first top structure 406 and the second top structure 412 from contacting each other.

Figure 8:
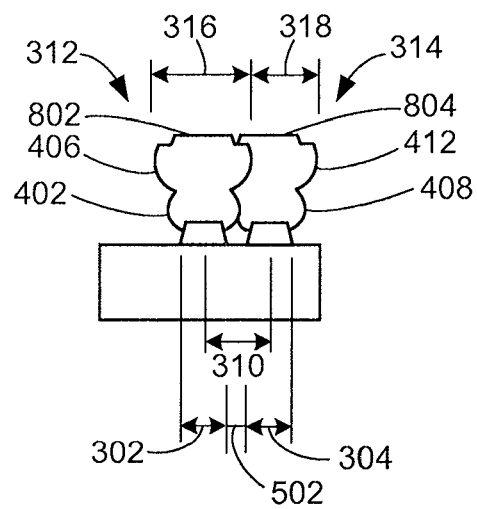
FIG. 8 is a cross-sectional view of the structure of FIG. 7 along line 8-8 of FIG. 7.

Referring now to FIG. 8, therein is shown a cross-sectional view of the structure of FIG. 7 along line 8-8 of FIG. 7. The cross-sectional view depicts the pitch 310 and the space 502 between the first conductive line 302 and the second conductive line 304. The first top structure 406 having the first top width 316 is preferably over the first bottom structure 402 and the first conductive line 302 extending into the space 502 between the first conductive line 302 and the second conductive line 304. The first top structure 406 preferably overhangs over at least a portion of the second conductive line 304.

A first top protrusion 802 preferably extends from a top portion of the first top structure 406. The first top protrusion 802 preferably has a planar top surface. The first top protrusion 802 may assist in the formation of the first connection stack 312 of FIG. 4, such as forming an intermetallic compound (IMC). The first top protrusion 802 may also provide the planar surface for the connection with the first stitch bond 324 of FIG. 3 of the first interconnect 320 of FIG. 3.

Similarly, the cross-sectional view depicts a portion of the second top structure 412 having the second top width 318 is preferably over the second bottom structure 408 and the second conductive line 304 extending into the space 502 between the second conductive line 304 and the second conductive line 304. The second top structure 412 preferably overhangs at least a portion the first conductive line 302.

A second top protrusion 804 preferably extends from a top portion of the second top structure 412. The second top protrusion 804 preferably has a planar top surface. The second top protrusion 804 may assist in the formation of the second connection stack 314 of FIG. 4, such as forming an intermetallic compound (IMC). The second top protrusion 804 may also provide the planar surface for the connection with the second stitch bond 326 of FIG. 3 of the second interconnect 322 of FIG. 3.

Figure 9:
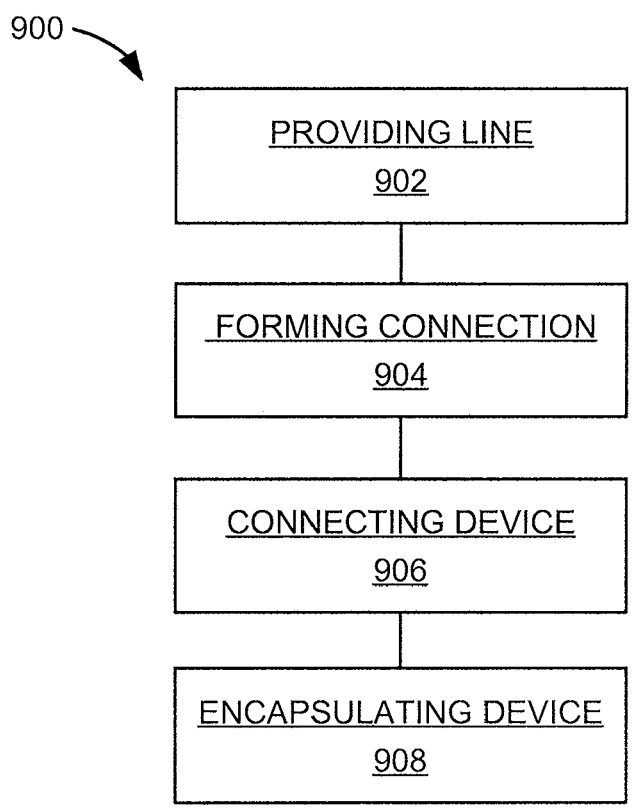
FIG. 9 is a flow chart of an integrated circuit package system for manufacturing the integrated circuit package system in an embodiment of the present invention.

Referring now to FIG. 9, therein is a flow chart of an integrated circuit package system 900 for manufacturing the integrated circuit package system 100 in an embodiment of the present invention. The system 900 includes providing a first conductive line adjacent to a second conductive line in a block 902; forming a first connection stack over the first conductive line with the first connection stack overhanging the second conductive line in a block 904; connecting an integrated circuit device and the first connection stack in a block 906; and encapsulating the integrated circuit device and the first connection stack in a block 908.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method for manufacturing an integrated circuit package system comprising:
   providing a first conductive line adjacent to a second conductive line;
   forming a first connection stack over the first conductive line with the first connection stack overhanging the second conductive line including:
      forming a first bottom structure over the first conductive line with the first bottom structure overhanging a space between the first conductive line and the second conductive line;
      forming a first top structure over the first bottom structure with the first top structure overhanging the space and at least a portion of the second conductive line;
   connecting an integrated circuit device and the first connection stack; and
   encapsulating the integrated circuit device and the first connection stack.

2. The method as claimed in claim 1 further comprising:
   forming a second connection stack over the second conductive line with the second connection stack overhanging the first conductive line in a staggered configuration to the first connection stack; and
   connecting the integrated circuit device and the second connection stack.

3. The method as claimed in claim 1 wherein forming the first connection stack over the first conductive line includes at least partially covering sides of the first conductive line.

4. The method system as claimed in claim 1 wherein forming the first connection stack is centered over the first conductive line.

5. A method for manufacturing an integrated circuit package system comprising:
- providing a first conductive line adjacent to a second conductive line, the first conductive line having a first line width and the second conductive line with a space in between line;
- forming a first connection stack centered over the first conductive line with the first connection stack overhanging the second conductive line, a first bottom structure over the first conductive line with the first bottom structure overhanging the space and not overhanging the second conductive line;
- forming a second connection stack centered over the second conductive line with the second connection stack overhanging the first conductive line, the first connection stack and the second connection stack are in an overhanging staggered configuration;
- connecting an integrated circuit device and the first connection stack;
- connecting the integrated circuit device and the second connection stack; and
- encapsulating the integrated circuit device, the first connection stack, and the second connection stack.

6. The method as claimed in claim 5 wherein connecting the integrated circuit device and the first connection stack includes forming a stitch bond on the first connection stack.

7. The method as claimed in claim 5 wherein:
- providing the first conductive line and the second conductive line includes:
  - providing the first conductive line having a first line width and the second conductive line with a space in between; and
- forming the first connection stack centered over the first conductive line includes:
  - forming the first connection stack having a first top width, the first top width is greater than the first line width and the space.

8. The method as claimed in claim 5 wherein:
- providing the first conductive line and the second conductive line includes:
  - providing the first conductive line having a first line width and the second conductive line with a pitch in between; and
- forming the first connection stack centered over the first conductive line includes:
  - forming the first connection stack having a first top width, the first top width is greater than the first line width and the pitch.

9. An integrated circuit package system comprising:
- a first conductive line;
- a second conductive line adjacent to the first conductive line;
- a first connection stack over the first conductive line with the first connection stack overhanging the second conductive line including:
  - a first bottom structure over the first conductive line with the first bottom structure overhanging a space between the first conductive line and the second conductive line;
  - a first top structure over the first bottom structure with the first top structure overhanging the space and at least a portion of the second conductive line;
- an integrated circuit device connected with the first connection stack; and
- an encapsulation over the integrated circuit device and the first connection stack.

10. The system as claimed in claim 9 further comprising a second connection stack over the second conductive line with the second connection stack overhanging the first conductive line in a staggered configuration to the first connection stack and connected with the integrated circuit device.

11. The system as claimed in claim 9 wherein the first connection stack over the first conductive line includes at least partially over sides of the first conductive line.

12. The system as claimed in claim 9 wherein the first connection stack is centered over the first conductive line.

13. The system as claimed in claim 9 further comprising:
- a second connection stack centered over the second conductive line and connected with the integrated circuit device;
wherein:
- the first connection stack is centered over the first conductive line; and
- the encapsulation is over the second connection stack.

14. The system as claimed in claim 13 wherein the integrated circuit device connected with the first connection stack includes a stitch bond on the first connection stack.

15. The system as claimed in claim 13 wherein:
- the first conductive line adjacent to the second conductive line includes:
  - the first conductive line having a first line width and the second conductive line with a space in between; and
- the first connection stack centered over the first conductive line includes:
  - the first connection stack having a first top width, the first top width is greater than the first line width and the space.

16. The system as claimed in claim 13 wherein:
- the first conductive line adjacent to the second conductive line includes:
  - the first conductive line having a first line width and the second conductive line with a pitch in between; and
- the first connection stack centered over the first conductive line includes:
  - the first connection stack having a first top width, the first top width is greater than the first line width and the pitch.

17. The system as claimed in claim 13 wherein:
- the first conductive line adjacent to the second conductive line includes:
  - the first conductive line having a first line width and the second conductive line with a space in between; and
- the first connection stack centered over the first conductive line includes:
  - a first bottom structure over the first conductive line with the first bottom structure overhanging the space and not overhanging the second conductive line.

* * * * *

UNITED STATES PATENT AND TRADEMARK OFFICE
CERTIFICATE OF CORRECTION

| | | |
|---|---|---|
| PATENT NO. | : 7,863,099 B2 | Page 1 of 1 |
| APPLICATION NO. | : 11/769512 | |
| DATED | : January 4, 2011 | |
| INVENTOR(S) | : Do et al. | |

It is certified that error appears in the above-identified patent and that said Letters Patent is hereby corrected as shown below:

Column 8 line 65, delete "method system" and insert therefor --method--

Column 9 line 6, delete "between line;" and insert therefor --between;--

Signed and Sealed this

Thirteenth Day of September, 2011

David J. Kappos
*Director of the United States Patent and Trademark Office*